United States Patent
Awagakubo et al.

(10) Patent No.: US 11,161,775 B2
(45) Date of Patent: *Nov. 2, 2021

(54) CONDUCTIVE COMPOSITION, METHOD FOR PRODUCING CONDUCTOR, AND METHOD FOR FORMING WIRE OF ELECTRONIC COMPONENT

(71) Applicant: SUMITOMO METAL MINING CO., LTD., Tokyo (JP)

(72) Inventors: Shingo Awagakubo, Ome (JP); Katsuhiro Kawakubo, Ome (JP)

(73) Assignee: SUMITOMO METAL MINING CO., LTD., Tokyo (JP)

( * ) Notice: Subject to any disclaimer, the term of this patent is extended or adjusted under 35 U.S.C. 154(b) by 70 days.

This patent is subject to a terminal disclaimer.

(21) Appl. No.: 16/608,029

(22) PCT Filed: Apr. 20, 2018

(86) PCT No.: PCT/JP2018/016337
§ 371 (c)(1),
(2) Date: Dec. 17, 2019

(87) PCT Pub. No.: WO2018/198986
PCT Pub. Date: Nov. 1, 2018

(65) Prior Publication Data
US 2020/0115274 A1    Apr. 16, 2020

(30) Foreign Application Priority Data
Apr. 28, 2017 (JP) .............................. JP2017-089294

(51) Int. Cl.
*H01B 1/16* (2006.01)
*C03C 8/00* (2006.01)
(Continued)

(52) U.S. Cl.
CPC ................ *C03C 8/18* (2013.01); *C03B 32/00* (2013.01); *C03C 4/14* (2013.01); *C03C 8/04* (2013.01);
(Continued)

(58) Field of Classification Search
CPC . H01B 1/00; H01B 1/16; H01B 1/122; C09D 5/24; B05D 5/12; C03C 4/14; C03C 8/18
See application file for complete search history.

(56) References Cited

U.S. PATENT DOCUMENTS

| 5,035,837 A | 7/1991 | Saeki et al. |
| 2013/0118573 A1* | 5/2013 | Adachi ............. H01L 31/02245 136/256 |

(Continued)

FOREIGN PATENT DOCUMENTS

| JP | H03-141502 A | 6/1991 |
| JP | 2002-280248 A | 9/2002 |

(Continued)

OTHER PUBLICATIONS

International Search Report dated May 22, 2018, issued in counterpart application No. PCT/JP2018/016337, with English translation. (5 pages).

(Continued)

*Primary Examiner* — Mark Kopec
(74) *Attorney, Agent, or Firm* — Westerman, Hattori, Daniels & Adrian, LLP (57) ABSTRACT

A conductive composition has excellent adhesiveness to a substrate and conductivity. For example, a conductive composition contains copper powder, cuprous oxide, a lead-free glass frit, and a carboxylic acid-based additive. The cuprous oxide is contained in an amount of at least 5.5 parts by mass and up to 25 parts by mass relative to 100 parts by mass of the copper powder. The lead-free glass frit contains a (Continued)

borosilicate zinc-based glass frit and a vanadium zinc-based glass frit. The borosilicate zinc-based glass frit contains boron oxide, silicon oxide, zinc oxide, and optional other components, among which boron oxide, silicon oxide, and zinc oxide serve as top-three oxide components in terms of content. The vanadium zinc-based glass frit contains vanadium oxide, zinc oxide, and optional other components, among which vanadium oxide and zinc oxide serve as top-two oxide components in terms of content.

13 Claims, 1 Drawing Sheet

(51) Int. Cl.
 C09D 5/24 (2006.01)
 C03C 8/18 (2006.01)
 C03B 32/00 (2006.01)
 C03C 4/14 (2006.01)
 C03C 8/04 (2006.01)
 H01B 13/00 (2006.01)
(52) U.S. Cl.
 CPC ............... *C09D 5/24* (2013.01); *H01B 1/16* (2013.01); *H01B 13/0036* (2013.01)

(56) References Cited

U.S. PATENT DOCUMENTS

| | | | | |
|---|---|---|---|---|
| 2013/0344342 | A1* | 12/2013 | Ogata | H01B 1/22 428/426 |
| 2014/0363681 | A1* | 12/2014 | Garcia | H05K 1/092 428/426 |
| 2016/0326044 | A1* | 11/2016 | Dietz | C03C 8/24 |

FOREIGN PATENT DOCUMENTS

| | | |
|---|---|---|
| JP | 2012-54113 A | 3/2012 |
| JP | 2015-144126 A | 8/2015 |
| JP | 2015-168587 A | 9/2015 |
| JP | 2016-213284 A | 12/2016 |
| JP | 2017-199543 A | 11/2017 |
| JP | 2017-199544 A | 11/2017 |

OTHER PUBLICATIONS

International Preliminary Report on Patentability (Form PCT/IB/373) issued in counterpart International application No. PCT/JP2018/016337 dated Oct. 29, 2019 with Form PCT/ISA/237, with English translation. (11 pages).

\* cited by examiner

CONDUCTIVE COMPOSITION, METHOD FOR PRODUCING CONDUCTOR, AND METHOD FOR FORMING WIRE OF ELECTRONIC COMPONENT

TECHNICAL FIELD

The present invention relates to a conductive composition, a method for producing a conductor, and a method for forming a wire of an electronic component using the same.

BACKGROUND ART

There is a method for forming wires and electrodes with conductors obtained by firing a conductive composition containing a conductive component as a method for forming a circuit on a substrate of an electronic component. In that case, for the conductive component, gold, silver, palladium, mixtures thereof, or the like is frequently being used. However, gold and palladium are noble metals and are thus expensive and vulnerable to price fluctuations owing to supply and demand conditions and the like. Consequently, use of these metals may lead to problems such as a cost increase in products and price fluctuations. Although silver is lower in price than gold and palladium, it has a problem in that it easily causes migration. Although nickel may be used apart from noble metals as the conductive component, it has a problem in that it has relatively low conductivity.

Given these circumstances, in recent years, copper, which has excellent conductivity, excellent migration resistance, and low price, has started to be used as the conductive component. A conductor is formed by applying a paste-like conductive composition (conductive paste) the viscosity of which is adjusted by adding an organic vehicle onto a substrate by printing such as screen printing and drying and then firing the conductive paste applied onto the substrate, for example. Copper is a metal easily oxidized, and firing of the conductive paste containing copper is generally performed in a reductive atmosphere or an inert gas atmosphere and is performed in a nitrogen gas, for example. When the conductive paste is fired in the atmosphere, copper is oxidized, and an oxide formed during the process may reduce conductivity.

The conductive composition containing copper often contains copper powder and a glass frit as main components. The glass frit has the effect of causing the conductive component to adhere together or causing a substrate and the conductive component to adhere to each other. For the glass frit, glass frits containing lead (lead glass frits) have been conventionally frequently used. The lead glass frits have low softening temperature and have excellent wettability with the conductive component and the substrate, and a conductive composition containing a lead glass frit has sufficient conductivity and adhesiveness to the substrate.

However, in recent years, restrictions on chemicals harmful to the environment have become strict, and lead is a substance to be restricted in the RoHS instructions and the like. Given these circumstances, a conductive composition containing a glass frit containing no lead (a lead-free glass frit) is being demanded.

When the circuit is formed on the substrate, apart from conductors such as wires and electrodes, resistors are also formed. The circuit is formed step-by-step by applying conductive paste and resistance paste onto the substrate by printing and then firing them under respective appropriate conditions or is formed by successively forming patterns of wires, electrodes, resistors, and the like on the substrate by application by printing and then simultaneously firing them at one piece of heat treatment, for example.

The resistance paste contains ruthenium oxide and a glass frit, for example. In such resistance paste, when it is fired in a nitrogen atmosphere, ruthenium oxide reacts with nitrogen, and a desired resistance cannot necessarily be obtained. Given these circumstances, when the conductive paste is required to be fired in a nitrogen atmosphere, employed is a method in which the resistance paste is applied and is fired in the atmosphere to form resistors, and then the conductor paste is applied and is fired in a nitrogen atmosphere to form conductors.

The resistors are fired to be formed earlier as described above, whereby formation of the conductors can be performed in the nitrogen atmosphere. However, heat treatment for forming the conductors is normally performed at 800° C. to 1,000° C., and although the influence of nitrogen on the resistors can be prevented, heat history by the heat treatment at the high temperature may have a detrimental effect on the resistors. Given these circumstances, a conductive composition that can be fired by heat treatment at a lower temperature, or 750° C. or less, for example, is being demanded.

Patent Literature 1 describes a copper paste composition containing inorganic components with copper powder, cuprous oxide powder, cupric oxide powder, and glass powder as main components and an organic vehicle component and states that this copper paste composition is suitable for low-temperature firing at 550 to 750° C. in particular, for example. However, in its examples, only glass powder containing lead is disclosed as the glass powder contained in this copper paste composition.

The lead-free glass frit, which does not substantially contain any lead, tends to be inferior to the lead glass frit in wettability with a substrate. Owing to this, a conductive composition containing the lead-free glass frit cannot necessarily sufficiently obtain adhesiveness between a conductor and the substrate. The tendency becomes conspicuous as a heat treatment temperature during firing is lowered in particular. Given these circumstances, a conductive composition containing the lead-free glass frit that can form a conductor having sufficient conductivity and adhesiveness is being demanded.

Patent Literature 2 discloses a copper paste composition containing copper powder, a lead-free glass frit, and cuprous oxide, the lead-free glass frit containing oxides of bismuth, boron, and silicon, and having a softening starting temperature of 400° C. or less, for example. It is stated that this copper paste composition has excellent adhesiveness to a ceramic substrate.

Patent Literature 3 discloses copper paste that has excellent electric characteristics and adhesive strength by adding lead-free glass frits such as a borosilicate-based glass frit ($SiO_2$—$B_2O_3$-based) and a borosilicate barium-based glass frit (BaO—$SiO_2$—$B_2O_3$-based) and a borosilicate zinc-based glass flit containing zinc oxide in a specific ratio as glass frits to be contained in copper paste for an external electrode.

CITATION LIST

Patent Literature

[Patent Literature 1] Japanese Unexamined Patent Application Publication No. H03-141502

[Patent Literature 2] Japanese Unexamined Patent Application Publication No. 2012-54113

[Patent Literature 3] Japanese Unexamined Patent Application Publication No. 2002-280248

SUMMARY OF INVENTION

Technical Problem

However, the copper paste described in Patent Literature 2 and the copper paste described in Patent Literature 3 form a conductor by firing at 900° C., and no study is conducted about whether a conductor having sufficient conductivity and adhesiveness can be obtained even when the copper pastes are fired at a low temperature of 750° C. or less.

The present invention has been studied in view of such circumstances, and an object thereof is to provide a conductive composition that can be fired even at a temperature of about 750° C. or less, has favorable adhesiveness to a substrate, and has excellent conductivity.

A first aspect of the present invention provides a conductive composition containing copper powder, cuprous oxide, a lead-free glass frit, and a carboxylic acid-based additive, the cuprous oxide being contained in an amount of at least 5.5 parts by mass and up to 25 parts by mass relative to 100 parts by mass of the copper powder, the lead-free glass frit containing a borosilicate zinc-based glass frit and a vanadium zinc-based glass frit, the borosilicate zinc-based glass frit containing boron oxide, silicon oxide, zinc oxide, and optional other components, among which boron oxide, silicon oxide, and zinc oxide serve as top-three oxide components in terms of content, the vanadium zinc-based glass frit containing vanadium oxide, zinc oxide, and optional other components, among which vanadium oxide and zinc oxide serve as top-two oxide components in terms of content, and the carboxylic acid-based additive being contained in an amount of at least 0.1 part by mass and up to 5 parts by mass relative to 100 parts by mass of the copper powder.

The vanadium zinc-based glass frit is preferably contained in an amount of at least 20% by mass and up to 80% by mass relative to 100% by mass of the lead-free glass frit. The vanadium zinc-based glass frit preferably contains vanadium oxide in an amount of at least 30% by mass and up to 50% by mass and contains zinc oxide in an amount of at least 30% by mass and up to 50% by mass. The borosilicate zinc-based glass frit is preferably contained in an amount of at least 20% by mass and up to 80% by mass relative to 100% by mass of the lead-free glass frit. The borosilicate zinc-based glass frit preferably contains zinc oxide in an amount of at least 25% by mass and up to 45% by mass. The lead-free glass frit is preferably contained in an amount of at least 0.2 part by mass and up to 9 parts by mass relative to 100 parts by mass of the copper powder. The carboxylic acid-based additive is preferably at least one selected from oleic acid and linoleic acid. The cuprous oxide is preferably contained in an amount of at least 5.5 parts by mass and up to 15 parts by mass relative to 100 parts by mass of the copper powder. The copper powder preferably contains at least either spherical powder or flake-shaped powder. The copper powder preferably has an average particle diameter of at least 0.2 μm and up to 5 μm. The conductive composition preferably contains an organic vehicle in an amount of at least 10% by mass and up to 50% by mass relative to 100% by mass of the conductive composition.

A second aspect of the present invention provides a method for producing a conductor including firing the conductive composition by heat treatment at 750° C. or less.

A third aspect of the present invention provides a method for forming a wire of an electronic component including: applying the conductive composition onto a substrate; and firing the substrate after the application by heat treatment at 750° C. or less.

Using the conductive composition of the present invention, a conductor that has excellent adhesiveness to a substrate and more excellent conductivity can be formed. The conductive composition of the present invention can be fired at a low temperature of 750° C. or less, and using the conductive composition of the present invention, a conductor can be formed without damaging resistors, internal elements, and the like of an electronic component. Consequently, an electronic component having electric characteristics similar to those of conventional ones or more can be produced lead-free and with a low defect rate.

DESCRIPTION OF EMBODIMENTS

1. Conductive Composition

A conductive composition of the present embodiment contains copper powder, cuprous oxide, a lead-free glass frit, and a carboxylic acid-based additive. The conductive composition does not contain any lead glass frit and thus does not substantially contain any lead and has excellent environmental characteristics. The lead-free glass frit refers to a glass frit that does not contain any lead or that, even when it contains lead, is extremely small in its content (e.g., the content of lead is 0.1% by mass or less relative to the entire glass frit). That the conductive composition does not substantially contain any lead refers to a state in which the content of lead is 0.01% by mass or less relative to the entire conductive composition, for example.

The following describes components forming the conductive composition.

(1) Copper Powder

The conductive composition of the present embodiment contains the copper powder as a conductive component. The copper powder has excellent conductivity and migration resistance and low price. The copper powder is easily oxidized, and when the conductive composition is subjected to heat treatment, it is normally subjected to heat treatment in a nitrogen atmosphere.

As to a method for producing the copper powder, which is not limited to a particular method, conventionally known methods such as atomization, wet reduction, and electrolysis can be used. When atomization is used, for example, the remaining concentration of impurities in copper powder to be obtained can be reduced, and the number of pores reaching the inside of the particles of the copper powder to be obtained from the surface thereof can be reduced, by which the copper powder can be inhibited from being oxidized.

The shape and particle diameter of the copper powder, which are not limited to particular ones, can be selected as appropriate in accordance with a target electronic component. As to the shape of the copper powder, a spherical or flake-shaped copper powder or a mixture of these can be used, for example. The copper powder contains the flake-shaped copper powder to increase the contact area of the copper powder and may have excellent conductivity, for example.

When the mixture of the spherical powder and flake-shaped copper powder is used, the copper powder can select the mixing ratios of the spherical powder and flake-shaped copper powder as appropriate depending on its use. As to the mixing ratios, relative to 100 parts by mass of the entire copper powder, the spherical copper powder can be contained in an amount of at least 10 parts by mass and up to 90 parts by mass, whereas the flake-shaped copper powder can be contained in an amount of up to 90 parts by mass and at least 10 parts by mass, for example.

The copper powder can have an average particle diameter of at least 0.2 µm and up to 5 µm for the spherical copper powder, for example. For the flake-shaped copper powder, the particle diameter flattened in a flake shape can be about at least 3 µm and up to 30 µm, for example. When the particle diameter is within the above range, applicability to an electronic component reduced in size is excellent. For the spherical copper powder, this average particle diameter is a median diameter (D50) of accumulated distribution and can be measured with a particle size distribution measuring apparatus based on a laser diffraction/scattering method. For the flake-shaped copper powder, the particle diameter can be measured by electron microscopic observation. For the copper powder, powder having the same particle diameter may be used, or two or more types of powder having different particle diameters may be used in a mixed manner.

Normally, reducing the particle diameter of the conductive powder can facilitate firing; when the average particle diameter of the spherical copper powder is less than 0.2 µm, for example, the copper powder is easily oxidized, and not only a sintering failure occurs on the contrary but also problems such as a shortage of capacity and a change in paste viscosity with the lapse of time may be likely to occur. The conductive composition of the present embodiment can sufficiently fire the copper powder even by low-temperature heat treatment at 750° C. or less, for example, by containing specific components described below even when the particle diameter of the copper powder is 1 µm or more, for example.

(2) Lead-Free Glass Frit

The conductive composition of the present embodiment contains a borosilicate zinc-based glass frit and a vanadium zinc-based glass frit as the lead-free glass frit. The conductive composition has excellent wettability to the copper powder and the substrate with a good balance even when the lead-free glass frit is contained by containing the glass frit with the above two kinds combined, and this conductive composition can obtain a conductor that has particularly excellent conductivity and adhesiveness even when it is fired at a temperature of 750° C. or less.

The borosilicate zinc-based glass frit refers to a glass frit containing boron oxide ($B_2O_3$), silicon oxide ($SiO_2$), zinc oxide (ZnO), and optional other components, among which $B_2O_3$, $SiO_2$, and ZnO serve as top-three oxide components in terms of content. The borosilicate zinc-based glass frit preferably contains ZnO in an amount of at least 25% by mass and up to 45% by mass, $SiO_2$ in an amount of at least 5% by mass and up to 15% by mass, and $B_2O_3$ in an amount of at least 35% by mass and up to 55% by mass relative to 100% by mass of the borosilicate zinc-based glass frit.

The composition of the borosilicate zinc-based glass frit can contain one or two or more components other than those described above and can contain oxides of alkali metals such as $Na_2O$; and $Al_2O_3$, for example. The amounts to be added of these other components are each preferably at least 0.5% by mass and up to 10% by mass.

The borosilicate zinc-based glass frit has a softening point of preferably 600° C. or less, more preferably at least 400° C. and up to 600° C., and even more preferably at least 500° C. and up to 600° C. When the softening point is within the above range, a conductor that has excellent conductivity and adhesiveness can be obtained even when low-temperature firing is performed. The softening point can be controlled by adjusting the composition of the glass frit as appropriate, for example. The softening point can be measured by thermogravimetric differential thermal analysis (TG-DTA) in the atmosphere with a temperature rising rate of 10° C./min.

The particle diameter of the borosilicate zinc-based glass frit, which is not limited to a particular value, is an average particle diameter of at least 1 µm and up to 10 µm, for example, and preferably at least 1 µm and up to 5 µm. The softening point of the borosilicate zinc-based glass frit is within the above range, and the particle diameter thereof is within the above range, whereby fused borosilicate zinc-based glass has excellent fluidity even in firing at a temperature of 750° C. or less, and a conductor that has particularly excellent adhesiveness can be obtained. The average particle diameter is a median diameter (D50) of accumulated distribution and can be measured with a particle size distribution measuring apparatus based on a laser diffraction/scattering method. As a laser diffraction/scattering particle diameter/particle size distribution measuring apparatus, a measuring apparatus called Microtrac (registered trademark) is known.

The vanadium zinc-based glass frit refers to a glass frit containing vanadium oxide ($V_2O_5$), zinc oxide (ZnO), and optional other components, among which $V_2O_5$ and ZnO serve as top-two oxide components in terms of content. The vanadium zinc-based glass frit preferably contains ZnO in an amount of at least 30% by mass and up to 50% by mass and $V_2O_5$ in an amount of at least 30% by mass and up to 50% by mass. The vanadium zinc-based glass frit can obtain a conductive composition that has excellent fluidity and excellent penetrability to the substrate even by heat treatment at a low temperature by containing $V_2O_5$.

The composition of the vanadium zinc-based glass frit can contain one or two or more components other than those described above and can contain oxides of alkali metals such as CaO; and $B_2O_3$, $Bi_2O_3$, and $Al_2O_3$, for example. The amounts to be added of these other components are each preferably at least 0% by mass and up to 10% by mass.

The vanadium zinc-based glass frit has a softening point of preferably 600° C. or less, more preferably at least 300° C. and up to 500° C., and even more preferably at least 350° C. and up to 450° C. When the softening point is within the above range, a conductive composition that has excellent fluidity can be obtained. The softening point can be controlled by adjusting the composition of the glass frit as appropriate, for example. The softening point can be measured by thermogravimetric differential thermal analysis (TG-DTA) in the atmosphere with a temperature rising rate of 10° C./min.

The particle diameter of the vanadium zinc-based glass frit, which is not limited to a particular value, is an average particle diameter of at least 1 µm and up to 10 µm, for example, and preferably at least 1 µm and up to 5 µm. When the softening point of the vanadium zinc-based glass frit is within the above range, and when the particle diameter thereof is within the above range, fused vanadium zinc-based glass that has excellent fluidity even in firing at a temperature of 750° C. or less, and a conductor that has particularly excellent adhesiveness can be obtained. This average particle diameter is a median diameter (D50) of accumulated distribution and can be measured with a particle size distribution measuring apparatus based on a laser diffraction/scattering method.

The softening point of the borosilicate zinc-based glass frit can be higher than the softening point of the vanadium zinc-based glass frit. The conductive composition has excellent fluidity of the glass fused from a temperature rising process when the conductive composition is fired and has excellent wettability to the conductive component and the substrate with a good balance by containing the glass frits having different softening points, and a conductor that has particularly excellent adhesiveness can be obtained. ZnO contained in these glass frits is reduced to zinc by residual char (soot and carbon) originating from the organic vehicle during a drying or firing process, and this zinc can inhibit the oxidation of the copper powder. The function of ZnO in the glass frits is not limited to the above.

The content of the lead-free glass frit can be selected as appropriate from an electronic component as an object to be applied, the kind of the glass frit to be used, characteristics obtained from the content of the copper powder, or the like, for example. The lower limit of the content of the lead-free glass frit is 0.2 part by mass or more, for example, preferably 1 part by mass or more, and more preferably 2 parts by mass or more relative to 100 parts by mass of the copper powder. The lower limit of the content of the lead-free glass frit is within the above range, whereby adhesiveness to the substrate is more excellent. The upper limit of the content of the lead-free glass frit, which is not limited to a particular value, is 15 parts by mass or less relative to 100 parts by mass of the copper powder, for example. When the conductive composition of the present embodiment is used for the formation of a conductive pattern, the upper limit thereof is preferably 9 parts by mass or less, more preferably 6 parts by mass or less, and even more preferably 5 parts by mass or less. The upper limit of the content of the lead-free glass frit is within the above range, whereby a formed electrode has more excellent solderability. When the content of the lead-free glass frit is extremely large, excessive glass is pushed out of the conductor during sintering, whereby the excessive glass remains on the surface of the electrode, which worsens solderability.

The content of the lead-free glass frit can be within a range of at least 0.5% by mass and up to 10% by mass, for example, and is in particular preferably at least 2% by mass and up to 8% by mass relative to the entire conductive paste.

The content of the vanadium zinc-based glass frit is at least 10% by mass and up to 90% by mass, for example, preferably at least 20% by mass and up to 80% by mass, and more preferably at least 40% by mass and up to 60% by mass relative to the entire lead-free glass frit. In the present embodiment, when the content of the vanadium zinc-based glass frit is within the above range, a conductor to be formed has excellent conductivity and adhesiveness to the substrate with a good balance.

The content of the borosilicate zinc-based glass frit is up to 90% by mass and at least 10% by mass, for example, preferably up to 80% by mass and at least 20% by mass, and more preferably up to 60% by mass and at least 40% by mass relative to the entire lead-free glass frit. In the present embodiment, when the content of the borosilicate zinc-based glass frit is within the above range, the conductor to be formed has excellent conductivity and adhesiveness to the substrate with a good balance.

The content of ZnO is preferably at least 30% by mass and up to 50% by mass and more preferably at least 35% by mass and up to 40% by mass relative to the entire lead-free glass frit. When the content of ZnO is within the above range, more excellent adhesiveness to the substrate is gained.

The content of $V_2O_5$ is preferably at least 5% by mass and up to 50% by mass, more preferably at least 10% by mass and up to 30% by mass, and even more preferably at least 10% by mass and up to 25% by mass relative to the entire lead-free glass frit. When the content of $V_2O_5$ is within the above range, more excellent adhesiveness to the substrate is gained.

The content of $B_2O_3$ is preferably at least 3% by mass and up to 50% by mass, more preferably at least 10% by mass and up to 45% by mass, and even more preferably at least 20% by mass and up to 40% by mass relative to the entire lead-free glass frit. The content of $SiO_2$ is preferably at least 2% by mass and up to 10% by mass relative to the entire lead-free glass frit.

(3) Cuprous Oxide

The conductive composition of the present embodiment contains cuprous oxide (copper(I) oxide: $Cu_2O$). With this composition, the sintering of the copper powder of copper conductive paste for low-temperature firing can be facilitated.

The content of cuprous oxide can be preferably at least 5.5 parts by mass and up to 25 parts by mass, for example, is more preferably at least 7 parts by mass and up to 25 parts by mass, and is even more preferably at least 10 parts by mass and up to 15 parts by mass relative to 100 parts by mass of the copper powder. When the content of copper oxide is within the above range, the sintering of the copper powder is facilitated, and more excellent conductivity and adhesiveness are gained. When the content of cuprous oxide exceeds 25 parts by mass relative to 100 parts by mass of the copper powder, excessive copper oxide that does not contribute to the sintering of copper serves as resistance even when the carboxylic acid-based additive described below is contained, which may cause insufficient conductivity.

The lead-free glass frit tends to have insufficient adhesiveness to the substrate when it is fired in a nonoxidative atmosphere (e.g., in a nitrogen gas atmosphere). However, when the conductive composition containing the lead-free glass frit and cuprous oxide is prepared to be paste-like, for example, and is then subjected to heat treatment in a nonoxidative atmosphere, a minute amount of oxygen is introduced from cuprous oxide into a firing atmosphere during the heat treatment, whereby adhesiveness to the substrate can be improved. Upon release of oxygen to the nonoxidative atmosphere, cuprous oxide becomes copper and forms a conductor obtained by firing the conductive composition together with the copper powder. The conductive composition of the present embodiment can markedly improve conductivity and adhesiveness to the substrate by combining the borosilicate zinc-base glass frit, the vanadium zinc-based glass frit, cuprous oxide with each other. The conductive composition of the present embodiment may contain a small amount of cupric oxide (copper(II) oxide: CuO) to the extent that the effects described above are not impaired. Cupric oxide can be contained in an amount of at least 0 part by mass and up to 5 parts by mass relative to 100 parts by mass of the copper powder, for example.

Cuprous oxide is preferably powdery, and its average particle diameter is preferably 5 µm or less. By using cuprous oxide powder with an average particle diameter of 5 µm or less, cuprous oxide can be dispersed and blended in the conductive composition. The lower limit of the average particle diameter of cuprous oxide, which is not limited to a particular value, can be 0.1 µm or more, for example. The average particle diameter of cuprous oxide can be measured by electron microscopic observation or with a particle size distribution measuring apparatus based on a laser diffraction/scattering method.

(4) Carboxylic Acid-Based Additive

The conductive composition of the present embodiment can further improve the effect of facilitating the sintering of the copper powder by cuprous oxide and can form a conductor that has more excellent adhesiveness, conductivity, and the like by containing the carboxylic acid-based additive.

Although cuprous oxide has the effect of facilitating the sintering of the copper powder as described above, and the sintering of the copper powder improves conductivity, not all cuprous oxide can facilitate sintering, and part thereof may be present unreacted.

It is considered that the conductive composition of the present embodiment can cause this unreacted cuprous oxide to further react by containing the carboxylic acid-based additive. It is considered that the sinterability of the copper powder improves through the reaction of cuprous oxide and the amount of cuprous oxide remaining in the conductor as an electric resistant component reduces, whereby conductivity can further be improved.

The content of the carboxylic acid-based additive can be preferably at least 0.1 part by mass and up to 5.0 parts by mass, for example, is more preferably at least 1.0 part by mass and up to 4.0 parts by mass, and is even more preferably at least 2.0 parts by mass and up to 3.0 parts by mass relative to 100 parts by mass of the copper powder. When the content of the carboxylic acid-based additive exceeds 5.0 parts by mass relative to 100 parts by mass of the copper powder, when the organic vehicle is added to the conductive composition to make a paste-like composition, problems in that the adhesiveness of a conductor obtained from the paste-like composition reduces and the copper powder dissolves by long-term storage to change the color of the paste-like composition may occur.

The carboxylic acid-based additive refers to a dispersant having a carboxy group and is preferably an unsaturated fatty acid that is liquid at room temperature. Examples of the carboxylic acid-based additive include myristoleic acid, palmitoleic acid, oleic acid, and linoleic acid; more preferably, more preferred is at least one selected from oleic acid and linoleic acid.

The carboxylic acid-based additive can also have a function as a dispersant for, when the organic vehicle is added to the conductive composition according to the present embodiment to make a paste-like composition, dispersing the copper powder and the lead-free glass frit into the organic vehicle. In view of obtaining the function as the dispersant to the organic vehicle, the carboxylic acid-based additive is preferably an unsaturated carboxylic acid with a carbon number of 14 to 18.

(5) Organic Vehicle

The conductive composition of the present embodiment may contain an organic vehicle. The organic vehicle adjusts the viscosity of the conductive composition and can make a paste-like composition having appropriate printability.

For the organic vehicle, the composition thereof is not limited to a particular composition, known ones used for conductive paste can be used. The organic vehicle contains a resin component and a solvent, for example. Examples of the resin component include a cellulose resin and an acrylic resin. Examples of the solvent include terpene-based solvents such as terpineol and dihydro terpineol and ether-based solvents such as ethylcarbitol and butylcarbitol, which are used singly or in a mixed manner.

The organic vehicle is a component that volatilizes or combusts when the conductive composition is dried or fired, and the content of the organic vehicle in the conductive composition is not limited to a particular content. The organic vehicle maybe added so as to cause the conductive composition to have appropriate viscosity and applicability, and its content can be adjusted as appropriate depending on its use or the like. The organic vehicle can be contained in an amount of at least 10% by mass and up to 50% by mass relative to 100% by mass of the paste-like conductive composition (the conductive paste), for example.

The conductive composition of the present embodiment may contain other components to the extent that the effects of the present invention are produced. An antifoaming agent, a dispersant, a coupling agent, or the like may be added to the conductive composition as appropriate as such other components, for example.

(6) Characteristics of Conductive Composition

The conductive composition of the present embodiment has particularly excellent conductivity and adhesiveness to the substrate of the conductor after firing and can thus suitably be used for the formation of a conductor. The conductive composition of the present embodiment can be fired by heat treatment at 750° C. or less and can further be fired even by heat treatment at 600° C. or less, and the formed conductor can have excellent conductivity and adhesiveness to the substrate. Consequently, the conductive composition of the present embodiment can suitably be used as conductive paste for low-temperature firing.

The conductive composition of the present embodiment has a sheet resistance in terms of a film thickness of 10 μm of the conductor fired at 600° C. of preferably 10 mΩ or less and more preferably 5 mΩ or less. This sheet resistance is a value measured by a method described in examples described below.

The conductive composition of the present embodiment has a peel strength of the conductor obtained by firing at 600° C. of preferably 20 N or more and more preferably 25 N or more. By adjusting the mixing ratios of the respective components of the conductive composition, the peel strength can be 30 N or more and can further be 40 N or more. The peel strength is a value measured when a Sn-plated Cu wire with a diameter of 0.6 mm is attached to a copper conductor produced by firing the conductive composition at 600° C. with a 3Ag-0.5Cu—Sn solder, and then the Sn-plated Cu wire is pulled to be destroyed, for example, and is a value evaluating adhesiveness between a substrate of an electronic component and the conductor.

The conductive composition of the present embodiment can be used for other than conductors such as wires and electrodes formed on the surface of the electronic component and may be used as internal electrodes and external electrodes of multilayer ceramic capacitors and a material for bonding chip components such as electronic elements to lead frames and various kinds of substrates to establish electric or thermal conduction as an alternative to solder, for example.

2. Method for Forming Conductor

The following describes a method for forming a conductor of the present embodiment.

First, a conductive composition containing copper powder, cuprous oxide, a lead-free glass frit, and a carboxylic acid-based additive is prepared. For the lead-free glass frit, one containing a borosilicate zinc-based glass frit and a vanadium zinc-based glass frit is used. An organic vehicle with the amount of a solvent therein adjusted is mixed into the conductive composition to produce paste (conductive paste) with the viscosity appropriately adjusted. The compositions and mixing ratios of the respective components in the conductive paste are as described above.

Next, the conductive paste is printed or applied onto a substrate or the like formed of ceramic or the like and is then fired through necessary processes to form a conductor. Firing is in general performed by heat treatment at at least 800° C. and up to 1,000° C. The conductive paste of the present embodiment can be sufficiently fired even by heat treatment at less than 800° C., can be fired even by heat treatment at 750° C. or less, for example, and can be fired even by heat treatment at 650° C. or less. The conductive paste of the present embodiment can provide a conductor that has particularly excellent conductivity and adhesiveness to the substrate even when it is fired by heat treatment at 600° C. as shown in the examples described below.

The lower limit of the heat treatment temperature of firing, which is not limited to a particular temperature, is 400° C. or more, for example. A firing treatment time is at least 5 minutes and up to 20 minutes at a peak temperature, for example.

Drying may be performed before firing. Conditions of drying are not limited to particular ones; it can be performed at 50° C. to 150° C. for about 5 minutes to 15 hours, for example. An oxygen concentration in a burnout zone within a firing furnace, which is not limited to a particular concentration, can be about 100 ppm, for example.

The conductive paste is applied onto the surface of a ceramic substrate or an electronic component formed on the ceramic substrate and is fired, whereby an electronic component formed with a circuit can be produced. The conductive paste is applied onto a ceramic substrate, and the substrate after application is fired, whereby an electronic component formed with wires can be produced. When the conductive composition of the present embodiment is used in this method of producing an electronic component, the conductive paste can be fired by heat treatment at 750° C. or less, and thus damage to resistors, internal elements, and the like can be reduced. The heat treatment can also be performed at 650° C. or less and can further also be performed at 600° C. or less. A conductor formed by this method of production has particularly excellent conductivity and adhesiveness to the substrate.

EXAMPLES

The following describes the present invention with reference to examples and comparative examples; these examples do not limit the present invention at all.

1. Raw Materials (1) Copper Powder (Spherical): Spherical copper powders with an average particle diameter of 0.3 μm, 1.0 μm, and 2.5 μm produced by atomization were used.

(2) Copper Powder (Flake-Shaped): Flake-shaped copper powder made flake-shaped by wet ball milling to give a particle diameter of 10 μm using the spherical copper powders produced by the above method as a raw material was used.

(3) Lead-Free Glass Frit

Borosilicate zinc-based glass frit: As a $ZnO$—$SiO_2$—$B_2O_3$-based glass frit with a softening point of 535° C., one containing ZnO in an amount of 36% by mass, $SiO_2$ in an amount of 10% by mass, and $B_2O_3$ in an amount of 45% by mass with an average particle diameter of 1.5 μm was used.

Vanadium zinc-based glass frit: As a $ZnO$-$V_2O_5$-based glass frit with a softening point of 405° C., one containing ZnO in an amount of 41% by mass and $V_2O_5$ in an amount of 39.5% by mass with an average particle diameter of 3.5 μm was used.

Borosilicate bismuth-based glass frit: As a $Bi_2O_3$—$SiO_2$—$B_2O_3$-based glass frit with softening point of 580° C., one containing $Bi_2O_3$ in an amount of 34.1% by mass, $B_2O_3$ in an amount of 24.4% by mass, and $SiO_2$ in an amount of 17% by mass with an average particle diameter of 1.5 μm was used. Table 1 lists the copper powder and the compositions of the lead-free glass frits used.

The average particle diameters of the spherical copper powder and the lead-free glass frits were measured with Microtrac. The average particle diameter of the flake-shaped copper powder was measured by scanning electron microscopic observation. The softening points of the lead-free glass frits were measured by thermogravimetric differential thermal analysis (TG-DTA) in the atmosphere with a temperature rising rate of 10° C./min.

TABLE 1

|  | $B_2O_3$ | ZnO | $SiO_2$ | $Na_2O$ | $Al_2O_3$ | — | — | — | Total |
|---|---|---|---|---|---|---|---|---|---|
| Borosilicate zinc-based glass frit | 45% by mass | 36% by mass | 10% by mass | 8% by mass | 1% by mass | — | — | — | 100% by mass |

|  | ZnO | $V_2O_5$ | $B_2O_3$ | CaO | $Bi_2O_3$ | $Al_2O_3$ | — | — | Total |
|---|---|---|---|---|---|---|---|---|---|
| Vanadium zinc-based glass frit | 41% by mass | 39.5% by mass | 7% by mass | 5.5% by mass | 4% by mass | 3% by mass | — | — | 100% by mass |

|  | $SiO_2$ | $Al_2O_3$ | $B_2O_3$ | ZnO | $Bi_2O_3$ | CaO | CuO | $P_2O_5$ | Total |
|---|---|---|---|---|---|---|---|---|---|
| Borosilicate bismuth-based glass frit | 17% by mass | 10% by mass | 24.4% by mass | 6.8% by mass | 34.1% by mass | 1.9% by mass | 3% by mass | 2.8% by mass | 100% by mass |

(4) For cuprous oxide, one with an average particle diameter of 3 μm was used.

(5) For the carboxylic acid-based additive, oleic acid and linoleic acid were used.

2. Production of Conductive Paste (Production of Organic Vehicle)

Relative to 80% by mass of terpineol, 18% by mass of ethyl cellulose and 2% by mass of an acrylic resin were mixed together, and the mixture was heated up to 60° C. while stirring to produce a transparent, viscous organic vehicle.

(Production of Conductive Paste)

The copper powder, the glass frits, cuprous oxide, oleic acid or linoleic acid, and the organic vehicle prepared as described above were mixed together with a mixer to obtain a mixture. Table 2 lists the mixing ratios of the respective components. This mixture was kneaded with a three-roll mill to produce conductive paste.

3. Formation of Conductor for Evaluation (1) Sample for Evaluating Sheet Resistance Gold paste was printed onto an alumina substrate and was fired to prepare an alumina substrate formed with gold (Au) electrodes with an inter-electrode distance of 50 mm. On the surface of the substrate, using a pattern with a width of 0.5 mm and an inter-electrode distance of 50 mm, the obtained conductive paste was printed between the Au electrodes so as to give a thickness after firing of 10 μm to 13 μm. This alumina substrate after printing was subjected to heat treatment at 120° C. to dry the conductive paste. The alumina substrate after drying treatment was subjected to heat treatment with a nitrogen atmospheric belt furnace with a profile of a peak temperature of 600° C., a peak temperature duration of 10 minutes, and a time from a furnace entrance to a furnace exit of 60 minutes to fire the conductive paste. The oxygen concentration of a firing zone within the furnace was set to 5 ppm. Dry air was introduced to a burnout zone provided in the process of rising temperature up to 600° C. (from the furnace entrance to a 600° C. zone) to set an oxygen concentration to each concentration of 200 ppm, 400 ppm, and 600 ppm. The oxygen concentration was measured using a zirconia oxygen concentration meter (manufactured by Toray: Model LC-750) and was adjusted to each of the concentrations.

(2) Sample for Evaluating Adhesiveness

The copper conductive paste for low-temperature firing described above was printed onto an alumina substrate with a pattern of 2 mm×2 mm and was fired under the same conditions as the conditions of production of the sample for evaluating a sheet resistance described above to produce a sample for evaluating adhesiveness (with a thickness of 10 μm after firing).

(3) Characteristics Evaluation of Formed Conductor (3-1) Sheet Resistance (Conductivity)

A resistance measuring probe of a digital multimeter (manufactured by Advantest Corporation) was brought into contact with the Au electrodes of the sample for evaluating a sheet resistance obtained as above to measure a resistance R[t] of the conductor. Subsequently, this resistance R[t] was converted into a sheet resistance Rs[t](=R(t)×W/L). Using this value, a sheet resistance Rs0 (=Rs[t]×t/10 (mΩ/□) when the thickness of the conductor was 10 μm was calculated, where t indicates the thickness of the conductor, W indicates the width of the conductor, and L indicates the length of the conductor. Table 2 lists these results.

(3-2) Adhesiveness to Substrate

A Sn-plated Cu wire with a diameter of 0.6 mm was soldered to the copper conductor of the obtained sample for evaluating adhesiveness using a solder with a composition of 96.5% by mass Sn-3% by mass Ag-0.5% by mass Cu and was pulled at a rate of 80 mm/min in the vertical direction using a load measuring instrument (manufactured by Aikoh Engineering Co., Ltd., MODEL 2152HTP). The peel strength when the conductor was peeled off from the substrate was measured at 20 points, and adhesiveness to the substrate was evaluated by its average.

TABLE 2

| | Conductive composition | | | | | | | | |
|---|---|---|---|---|---|---|---|---|---|
| | Copper powder | | | | | | Glass frits (100% by mass) | | |
| | Spherical powder | Spherical powder | Spherical powder | Flake | | | | | |
| | 0.3 μm Parts by mass | 1.0 μm Parts by mass | 2.5 μm Parts by mass | powder Parts by mass | Total Parts by mass | Lead-free glass frit Parts by mass | Borosilicate zinc % by mass | Vanadium zinc % by mass | Borosilicate bismuth % by mass |
| Example 1 | 100 | 0 | 0 | 0 | 100 | 1.4 | 90 | 10 | 0 |
| Example 2 | 100 | 0 | 0 | 0 | 100 | 1.3 | 60 | 40 | 0 |
| Example 3 | 100 | 0 | 0 | 0 | 100 | 1.4 | 60 | 40 | 0 |
| Example 4 | 100 | 0 | 0 | 0 | 100 | 1.5 | 60 | 40 | 0 |
| Example 5 | 100 | 0 | 0 | 0 | 100 | 1.4 | 10 | 90 | 0 |
| Example 6 | 100 | 0 | 0 | 0 | 100 | 2.7 | 50 | 50 | 0 |
| Example 7 | 50 | 50 | 0 | 0 | 100 | 2.7 | 50 | 50 | 0 |
| Example 8 | 0 | 100 | 0 | 0 | 100 | 2.7 | 50 | 50 | 0 |
| Example 9 | 75 | 0 | 0 | 25 | 100 | 5.6 | 50 | 50 | 0 |
| Example 10 | 25 | 0 | 0 | 75 | 100 | 5.6 | 50 | 50 | 0 |
| Example 11 | 15 | 0 | 85 | 0 | 100 | 5.6 | 50 | 50 | 0 |
| Example 12 | 20 | 0 | 42.5 | 37.5 | 100 | 5.6 | 50 | 50 | 0 |
| Example 13 | 85 | 0 | 15 | 0 | 100 | 8.5 | 50 | 50 | 0 |
| Example 14 | 15 | 0 | 85 | 0 | 100 | 11.6 | 50 | 50 | 0 |
| Example 15 | 100 | 0 | 0 | 0 | 100 | 1.4 | 60 | 40 | 0 |
| Example 16 | 100 | 0 | 0 | 0 | 100 | 1.4 | 60 | 40 | 0 |
| Example 17 | 100 | 0 | 0 | 0 | 100 | 1.4 | 60 | 40 | 0 |
| Example 18 | 100 | 0 | 0 | 0 | 100 | 1.4 | 60 | 40 | 0 |
| Example 19 | 100 | 0 | 0 | 0 | 100 | 1.4 | 90 | 10 | 0 |
| Comparative Example 1 | 100 | 0 | 0 | 0 | 100 | 1.4 | 100 | 0 | 0 |
| Comparative Example 2 | 100 | 0 | 0 | 0 | 100 | 1.4 | 0 | 100 | 0 |
| Comparative Example 3 | 100 | 0 | 0 | 0 | 100 | 1.4 | 60 | 0 | 40 |

TABLE 2-continued

| | | | | | | | | |
|---|---|---|---|---|---|---|---|---|
| Comparative Example 4 | 100 | 0 | 0 | 0 | 100 | 1.3 | 50 | 50 | 0 |
| Comparative Example 5 | 100 | 0 | 0 | 0 | 100 | 1.4 | 60 | 40 | 0 |
| Comparative Example 6 | 100 | 0 | 0 | 0 | 100 | 1.4 | 90 | 10 | 0 |
| Comparative Example 7 | 100 | 0 | 0 | 0 | 100 | 2.7 | 50 | 50 | 0 |

| | Conductive composition | | | | Firing conditions | | Conductor | |
|---|---|---|---|---|---|---|---|---|
| | Glass frits (100% by mass) | $Cu_2O$ | Carboxylic acid-based additive | | Organic vehicle | Atmosphere | Peak temperature | Conductivity | Adhesiveness (average) |
| | | | Oleic acid | Linoleic acid | | | | | |
| | Total % by mass | Parts by mass | Parts by mass | Parts by mass | % by mass | — | ° C. | mΩ | N |
| Example 1 | 100 | 13.6 | 2.5 | — | 18.1 | Nitrogen | 600 | 2.7 | 16.2 |
| Example 2 | 100 | 8.2 | 2.5 | — | 18.1 | Nitrogen | 600 | 2.3 | 55.1 |
| Example 3 | 100 | 13.6 | 2.5 | — | 18.1 | Nitrogen | 600 | 2.2 | 58.3 |
| Example 4 | 100 | 20.6 | 2.5 | — | 18.1 | Nitrogen | 600 | 2.4 | 49.3 |
| Example 5 | 100 | 13.6 | 2.5 | — | 18.1 | Nitrogen | 600 | 3.4 | 16.7 |
| Example 6 | 100 | 8.1 | 2.5 | — | 18.0 | Nitrogen | 600 | 2.3 | 51.4 |
| Example 7 | 100 | 8.1 | 2.5 | — | 18.0 | Nitrogen | 600 | 3.4 | 32 |
| Example 8 | 100 | 8.1 | 2.5 | — | 18.0 | Nitrogen | 600 | 3.5 | 24.2 |
| Example 9 | 100 | 8.3 | 2.5 | — | 18.0 | Nitrogen | 600 | 2.7 | 46.4 |
| Example 10 | 100 | 8.3 | 2.5 | — | 18.0 | Nitrogen | 600 | 4.1 | 28.6 |
| Example 11 | 100 | 8.3 | 2.5 | — | 18.0 | Nitrogen | 600 | 3.8 | 45.4 |
| Example 12 | 100 | 8.3 | 2.5 | — | 18.0 | Nitrogen | 600 | 3.7 | 33.8 |
| Example 13 | 100 | 8.5 | 2.5 | — | 17.2 | Nitrogen | 600 | 2.8 | 66.7 |
| Example 14 | 100 | 8.4 | 2.5 | — | 17.0 | Nitrogen | 600 | 4.2 | 54.2 |
| Example 15 | 100 | 13.6 | 0.1 | — | 18.1 | Nitrogen | 600 | 2.3 | 53.4 |
| Example 16 | 100 | 13.6 | 1.0 | — | 18.1 | Nitrogen | 600 | 2.3 | 55.9 |
| Example 17 | 100 | 13.6 | 4.0 | — | 18.1 | Nitrogen | 600 | 2.3 | 56.3 |
| Example 18 | 100 | 13.6 | 5.0 | — | 18.1 | Nitrogen | 600 | 2.4 | 53.1 |
| Example 19 | 100 | 13.6 | — | 2.5 | 18.1 | Nitrogen | 600 | 2.9 | 14.9 |
| Comparative Example 1 | 100 | 13.6 | 2.5 | — | 18.1 | Nitrogen | 600 | 2.7 | Electrode peeling |
| Comparative Example 2 | 100 | 13.6 | 2.5 | — | 18.1 | Nitrogen | 600 | 3.4 | Electrode peeling |
| Comparative Example 3 | 100 | 13.6 | 2.5 | — | 18.1 | Nitrogen | 600 | 3.5 | Electrode peeling |
| Comparative Example 4 | 100 | 3.1 | 2.5 | — | 18.0 | Nitrogen | 600 | 5.5 | Electrode peeling |
| Comparative Example 5 | 100 | 13.6 | 5.5 | — | 18.1 | Nitrogen | 600 | 5.7 | 21.9 |
| Comparative Example 6 | 100 | 13.6 | — | — | 18.1 | Nitrogen | 600 | 2.9 | 13.1 |
| Comparative Example 7 | 100 | 8.1 | — | — | 18.0 | Nitrogen | 600 | 2.4 | 47.4 |

[Evaluation Results]

As listed in Table 2, the conductive compositions of the examples have sufficient adhesiveness to the substrate and can obtain a conductor having sufficient conductivity. The conductive compositions of Examples 1 to 12, in which the content of the vanadium zinc-based glass frit is within a range of 10% by mass to 90% by mass relative to the entire glass frit (100% by mass), have excellent conductivity and adhesiveness. Among them, in Example 3 to Example 7 and Example 10 to Example 12, in which the content of the vanadium zinc-based glass frit is 40% by mass to 60% by mass, the conductive compositions have particularly excellent adhesiveness. Examples 13 to 23, in which the spherical copper powder (with an average particle diameter of 1.0 μm or 2.5 μm) and the flake-shaped copper powder are contained, also show favorable results, or a tendency of having excellent conductivity.

In contrast, in Comparative Example 1, in which only the borosilicate zinc-based glass frit was contained as the glass frit, resulting in particularly poor adhesiveness, and thus a stable conductor was not able to be formed. In Comparative Example 2, in which only the vanadium zinc-based glass frit was contained as the glass frit, the glass component penetrated the substrate too much, and the shape of the conductor (a wire shape) was not able to be held, owing to which adhesiveness was not able to be evaluated.

In Comparative Example 3, in which the borosilicate zinc-based glass frit and the borosilicate bismuth-based glass frit were contained as the glass frit, it was recognized that the glass did not sufficiently fuse, resulting in poor adhesiveness. In Comparative Example 4, in which the content of cuprous oxide is less than 5.5 parts by mass, resulting in particularly poor adhesiveness, and thus a stable conductor was not able to be formed.

In Comparative Example 5, in which oleic acid as the carboxylic acid-based additive was excessively contained, it was recognized that the conductor had poor conductivity and adhesiveness. It is considered that this is because oleic acid being excessively present not only improved the sinterability of cuprous oxide but also caused dissolution or the like of the copper powder, which reduced conductivity and the like on the contrary. It was recognized that in the sample of Comparative Example 4 the produced conductive paste changed its color with the lapse of time because excessive oleic acid dissolved the copper powder.

Figure 1A:
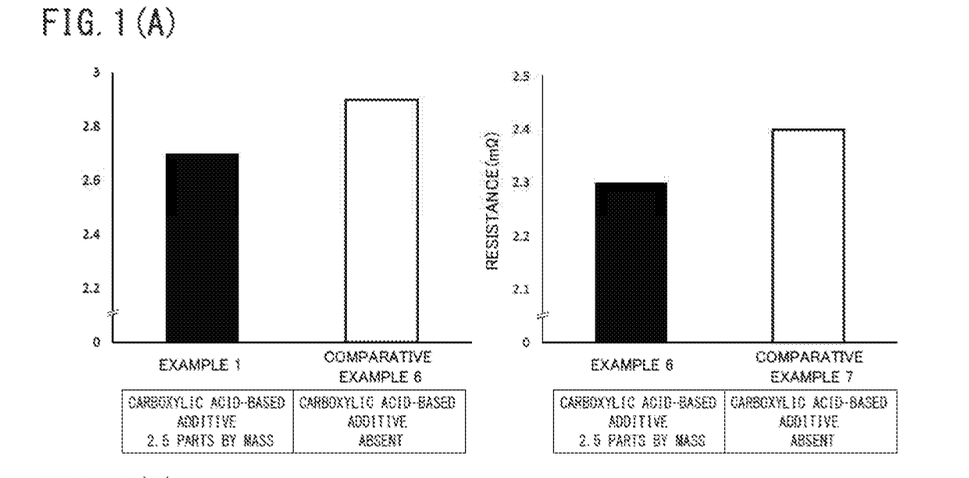
FIG. 1(A) and FIG. 1(B) are graphs of evaluation results of Examples 1 and 6 and Comparative Examples 6 and 7.
Figure 1B:
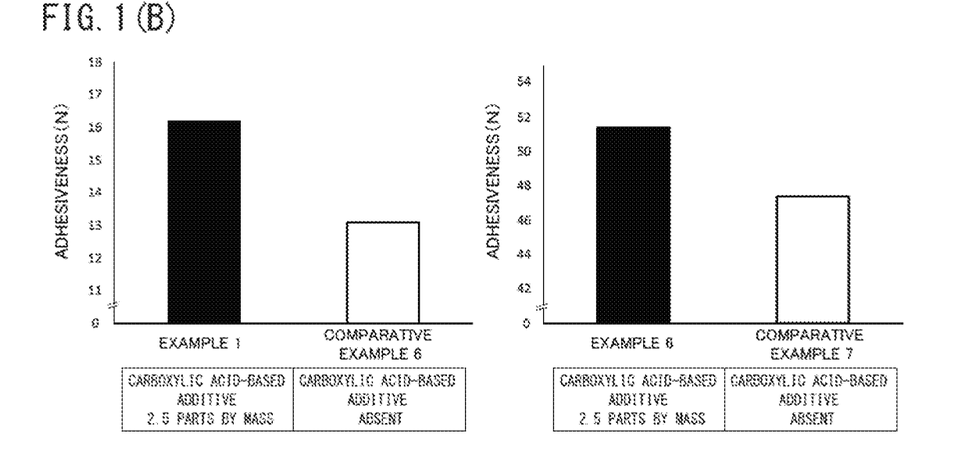

It was shown that the conductor of Comparative Example 6, which was obtained under the same conditions as those of Example 1 except that the carboxylic acid-based additive was not contained, reduced in conductivity and adhesiveness compared with the conductor of Example 1 (refer to FIG. 1). The conductor of Comparative Example 7, which was obtained under the same conditions as those of Example 6 except that the carboxylic acid-based additive was not contained, showed a similar tendency (refer to FIG. 1). These results show that containing the carboxylic acid-based additive further improves conductivity and adhesiveness.

From the foregoing, it is clear that using the conductive composition of the present embodiment can form a conductive pattern that has particularly excellent conductivity and adhesiveness to the substrate when it is fired at a low temperature of 750° C. or less, or about 600° C., for example.

INDUSTRIAL APPLICABILITY

The conductive composition of the present embodiment has particularly excellent conductivity and adhesive strength to the substrate and can suitably be used for the formation of electrodes such as wires by containing copper powder, specific lead-free glass frits, and cuprous oxide. The conductive composition of the present embodiment can also be used as internal electrodes and external electrodes of electronic components, an alternative to solder, and the like.

The technical scope of the present invention is not limited to the embodiment. One or more of the requirements described in the embodiment may be omitted, for example. The requirements described in the embodiment can be combined with each other as appropriate. To the extent that laws permit, the disclosure of Japanese Patent Application No. 2017-089294 as a Japanese patent application and all the pieces of literature cited in the embodiment and the like is incorporated herein by reference and is made part of this document.

The invention claimed is:

1. A conductive composition comprising copper powder, cuprous oxide, a lead-free glass frit, and a carboxylic acid-based additive,
    the cuprous oxide being contained in an amount of at least 5.5 parts by mass and up to 25 parts by mass relative to 100 parts by mass of the copper powder,
    the lead-free glass fit containing a borosilicate zinc-based glass fit and a vanadium zinc-based glass frit,
    the borosilicate zinc-based glass frit containing boron oxide, silicon oxide, zinc oxide, and optional other components, among which boron oxide, silicon oxide, and zinc oxide serve as top-three oxide components in terms of content,
    the vanadium zinc-based glass frit containing vanadium oxide, zinc oxide, and optional other components, among which vanadium oxide and zinc oxide serve as top-two oxide components in terms of content, and
    the carboxylic acid-based additive being contained in an amount of at least 0.1 part by mass and up to 5 parts by mass relative to 100 parts by mass of the copper powder.

2. The conductive composition according to claim 1, wherein the vanadium zinc-based glass frit is contained in an amount of at least 20% by mass and up to 80% by mass relative to 100% by mass of the lead-free glass frit.

3. The conductive composition according to claim 1, wherein the vanadium zinc-based glass frit contains vanadium oxide in an amount of at least 30% by mass and up to 50% by mass and contains zinc oxide in an amount of at least 30% by mass and up to 50% by mass.

4. The conductive composition according to claim 1, wherein the borosilicate zinc-based glass frit is contained in an amount of at least 20% by mass and up to 80% by mass relative to 100% by mass of the lead-free glass frit.

5. The conductive composition according to claim 1, wherein the borosilicate zinc-based glass frit contains zinc oxide in an amount of at least 25% by mass and up to 45% by mass.

6. The conductive composition according to claim 1, wherein the lead-free glass frit is contained in an amount of at least 0.2 part by mass and up to 9 parts by mass relative to 100 parts by mass of the copper powder.

7. The conductive composition according to claim 1, wherein the carboxylic acid-based additive is at least one selected from oleic acid and linoleic acid.

8. The conductive composition according to claim 1, wherein the cuprous oxide is contained in an amount of at least 5.5 parts by mass and up to 15 parts by mass relative to 100 parts by mass of the copper powder.

9. The conductive composition according to claim 1, wherein the copper powder contains at least either spherical powder or flake-shaped powder.

10. The conductive composition according to claim 1, wherein the copper powder has an average particle diameter of at least 0.2 μm and up to 5 μm.

11. The conductive composition according to claim 1, wherein the conductive composition contains an organic vehicle in an amount of at least 10% by mass and up to 50% by mass relative to 100% by mass of the conductive composition.

12. A method for producing a conductor, the method comprising firing the conductive composition according to claim 1 by heat treatment at 750° C. or less.

13. A method for forming a wire of an electronic component, the method comprising:
    applying the conductive composition according claim 1 onto a substrate; and
    firing the substrate after the application by heat treatment at 750° C. or less.

* * * * *